(12) United States Patent
Ogawa et al.

(10) Patent No.: US 9,633,922 B2
(45) Date of Patent: Apr. 25, 2017

(54) SEALING EPOXY RESIN COMPOSITION, HARDENED PRODUCT, AND SEMICONDUCTOR DEVICE

(71) Applicant: Panasonic Intellectual Property Management Co., Ltd., Osaka (JP)

(72) Inventors: Kazuto Ogawa, Kyoto (JP); Kyoko Nishidono, Osaka (JP); Emi Iwatani, Nara (JP); Keigo Takagi, Mie (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/154,956

(22) Filed: May 14, 2016

(65) Prior Publication Data

US 2016/0260645 A1    Sep. 8, 2016

Related U.S. Application Data

(63) Continuation of application No. PCT/JP2016/000336, filed on Jan. 25, 2016.

(30) Foreign Application Priority Data

Jan. 30, 2015    (JP) .................. 2015-016199

(51) Int. Cl.

| | |
|---|---|
| *H01L 23/29* | (2006.01) |
| *C08G 59/62* | (2006.01) |
| *C08G 59/68* | (2006.01) |
| *C08L 63/00* | (2006.01) |
| *C08K 3/00* | (2006.01) |
| *C08K 5/50* | (2006.01) |
| *C09J 163/00* | (2006.01) |
| *C08G 59/24* | (2006.01) |
| *H01L 23/31* | (2006.01) |
| *H01L 23/495* | (2006.01) |

(52) U.S. Cl.
CPC .......... *H01L 23/295* (2013.01); *C08G 59/245* (2013.01); *C08G 59/621* (2013.01); *C08G 59/68* (2013.01); *C08G 59/688* (2013.01); *C08K 3/00* (2013.01); *C08K 5/50* (2013.01); *C08L 63/00* (2013.01); *C09J 163/00* (2013.01); *H01L 23/3121* (2013.01); *H01L 23/495* (2013.01); *H01L 2224/16245* (2013.01); *H01L 2224/32225* (2013.01); *H01L 2224/32245* (2013.01); *H01L 2224/48091* (2013.01); *H01L 2224/48247* (2013.01); *H01L 2224/73265* (2013.01); *H01L 2924/1033* (2013.01); *H01L 2924/10272* (2013.01); *H01L 2924/14* (2013.01)

(58) Field of Classification Search
None
See application file for complete search history.

(56) References Cited

U.S. PATENT DOCUMENTS

| | | | |
|---|---|---|---|
| 2009/0234080 A1 | 9/2009 | Goh | |
| 2014/0179827 A1* | 6/2014 | Kim ..................... | C07F 9/5442 523/400 |

FOREIGN PATENT DOCUMENTS

| | | | | | |
|---|---|---|---|---|---|
| JP | 58-119654 | A | * | 7/1983 | ............. H01L 23/30 |
| JP | 61-293216 | A | * | 12/1986 | ............. C08G 59/40 |
| JP | 63-190893 | A | * | 8/1988 | ................ C07F 9/54 |
| JP | 63-290889 | A | * | 11/1988 | ................ C07F 9/54 |
| JP | 07-330787 | A | * | 12/1995 | ................ C07F 9/54 |
| JP | 2002-179768 | | | 6/2002 | |
| JP | 2004-256643 | | | 9/2004 | |
| JP | 2004-269586 | | | 9/2004 | |
| JP | 2005-162944 | | | 6/2005 | |
| JP | 2006-124643 | | | 5/2006 | |
| JP | 2007-119710 | | | 5/2007 | |
| JP | 4429768 | B | | 3/2010 | |
| WO | 03/082976 | | | 10/2003 | |

OTHER PUBLICATIONS

Machine translation of JP 63-290889 A (no date).*
Machine translation of JP 58-119654 A (no date).*
Machine translation of JP 61-293216 A (no date).*
Machine translation of JP 07-330787 A (no date).*
Machine translation of JP 63-190893 A (no date).*
International Search Report of PCT application No. PCT/JP2016/000336 dated Feb. 16, 2016.

* cited by examiner

*Primary Examiner* — Michael J Feely
(74) *Attorney, Agent, or Firm* — Greenblum & Bernstein, P.L.C.

(57) ABSTRACT

A sealing epoxy resin composition contains a phosphonium salt shown in Formula (1), an epoxy resin, a hardening agent, and an inorganic filler. In Formula (1), $R^1$-$R^3$ each represent an aryl group having 6 to 12 carbon atoms, $R^4$ represents an alkyl group having 1 to 4 carbon atoms, $R^6$ and $R^8$ each represent either a carboxyl group or a hydroxyl group, $R^5$ and $R^7$ each represent either hydrogen or an alkyl group having 1 to 4 carbon atoms, $R^9$ and $R^{11}$ represent hydrogen, $R^{10}$ represents either a carboxyl group or a hydroxyl group, and the relation of $r \leq 1$ is satisfied.

8 Claims, 1 Drawing Sheet

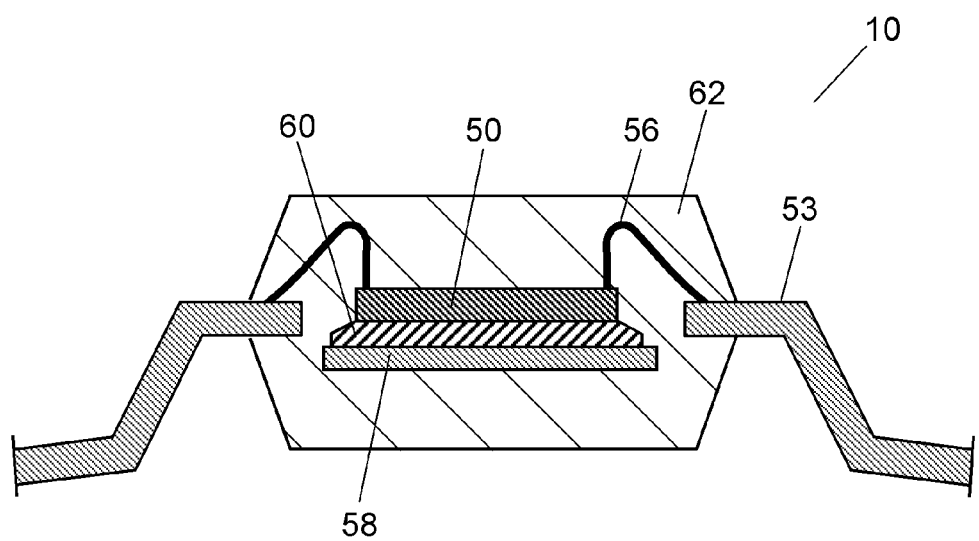

SEALING EPOXY RESIN COMPOSITION, HARDENED PRODUCT, AND SEMICONDUCTOR DEVICE

BACKGROUND

1. Technical Field

The present disclosure relates to a sealing epoxy resin composition, a hardened product of this composition, and a semiconductor device sealed with the resin composition.

2. Background Art

In general, semiconductor elements such as transistors, ICs, and LSIs are sealed with an epoxy resin composition so as to be used as semiconductor devices. Such plastic packaging protects the semiconductor elements from external environment or improves their handling ability.

It is a common practice to add a hardening accelerator to the epoxy resin composition in order to accelerate the hardening reaction to form a hardened product. Examples of the hardening accelerator include the following: nitrogen-containing heterocyclic compounds, phosphine compounds, quaternary ammonium compounds, quaternary phosphonium compounds, and arsonium compounds. Examples of the nitrogen-containing heterocyclic compound include amines, imidazole compounds, and 1,8-diazabicyclo[5.4.0]undecene-7.

Epoxy resin compositions containing quaternary phosphonium compounds have particularly excellent moisture-resistance reliability and preservation stability. These compositions therefore are used in thin packages as a sealing material required to have high fluidity. One of the most commonly used quaternary phosphonium compounds is tetraphenylphosphonium tetraphenylborate (hereinafter, TPPK).

The TPPK is, as it is, very stable and catalytically inactive. Therefore, it is previously heated with a phenol resin in order to produce a phenol resin salt, which is added to the epoxy resin composition. However, the production of the phenol resin salt from the TPPK generates trace amounts of benzene and causes environmental pollution when the benzene is released to the environment from the resin composition.

As a hardening accelerator that does not cause such problems, there has been proposed a phenol resin salt of alkyl quaternized phosphonium, which is derived from triphenylphosphonium (hereinafter, TPP) (see Japanese Unexamined Patent Application Publications No. 2004-256643 (PLT1) and No. 2005-162944 (PLT2)).

As another hardening accelerator, a phosphonium salt in the form of particles is proposed to ensure the fluidity of the epoxy resin composition when melted (see Japanese Unexamined Patent Application Publications No. 2006-124643 (PLT3) and No. 2007-119710 (PLT4)).

Furthermore, Japanese Patent No. 4429768 (PLT5) discloses a method of producing an intermediate composed of a quaternary phosphonium cation and an organic carboxylate anion.

SUMMARY

The present disclosure provides a sealing epoxy resin composition which is excellent in fluidity, hardening properties, and preservation stability. This resin composition is also unlikely to release benzene attributed to a hardening accelerator and prevents the hardening accelerator from remaining unmelted. The present disclosure also provides a hardened product of this resin composition and a semiconductor device sealed with the resin composition.

The sealing epoxy resin composition of the present disclosure contains a phosphonium salt shown in Formula (1) as shown below, an epoxy resin, a hardening agent, and an inorganic filler.

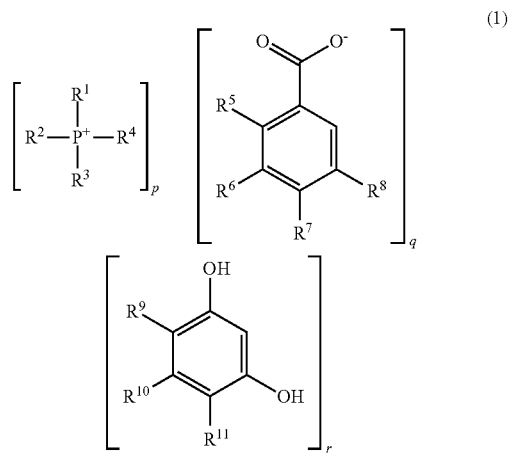

In Formula (1), $R^1$-$R^3$ are independent and each represent an aryl group having 6 to 12 carbon atoms; $R^4$ represents an alkyl group having 1 to 4 carbon atoms; $R^6$ and $R^8$ are independent and each represent either a carboxyl group (COOH) or a hydroxyl group (OH); $R^5$ and $R^7$ are independent and each represent either hydrogen (H) or an alkyl group having 1 to 4 carbon atoms; $R^9$ and $R^{11}$ each represent H; and $R^{10}$ represents either COOH or OH. In Formula (1), the relation of $r \leq 1$ is satisfied.

The hardened product of the present disclosure is obtained by hardening the above-mentioned sealing epoxy resin composition.

The semiconductor device of the present disclosure includes a semiconductor element and a sealant to seal the semiconductor element. This sealant is the above-mentioned hardened product.

The sealing epoxy resin composition of the present disclosure is excellent in fluidity, hardening properties, and preservation stability. The resin composition is unlikely to release benzene attributed to a hardening accelerator and prevents the hardening accelerator from remaining unmelted. The sealing epoxy resin composition can be formed into a hardened product and also be used to seal a semiconductor device.

BRIEF DESCRIPTION OF DRAWING

FIGURE is a sectional view of a semiconductor device according to an exemplary embodiment of the present disclosure.

DETAILED DESCRIPTION OF PREFERRED EMBODIMENTS

Prior to describing an exemplary embodiment of the present disclosure, problems in the conventional technologies will now be described in brief.

Epoxy resin compositions containing hardening accelerators disclosed in PTLs 1 and 2 are easily hardened and difficult to be stored for a long time. In addition, heating for melting such an epoxy resin composition quickens its hardening reaction and therefore increases the melt viscosity of the resin composition too rapidly before the melted resin composition is fully injected into the mold.

The epoxy resin composition used for sealing semiconductor elements contains an inorganic filler, and therefore, an increase in the melt viscosity due to progress of the hardening reaction greatly affects the moldability. Specifically, the epoxy resin composition being molded can sweep the wires attached to the semiconductor element or can cause weld voids due to insufficient filling of the epoxy resin composition in the mold.

On the other hand, even if the particles of the phosphonium salt disclosed in PTLs 3 and 4 is used after being pulverized, it is difficult to dissolve or disperse them in the epoxy resin composition. Therefore, when a semiconductor element is sealed in, for example, a flip-chip package, some of the particles may fit into gaps between small bumps, thereby causing insulation failure.

The exemplary embodiment of the present disclosure will now be described as follows. The sealing epoxy resin composition (hereinafter, resin composition) of the present exemplary embodiment contains a phosphonium salt, an epoxy resin, a hardening agent, and an inorganic filler.

The phosphonium salt has a structure shown in Formula (1). In Formula (1), $R^1$-$R^3$ are independent and each represent an aryl group having 6 to 12 carbon atoms. $R^1$ represents an alkyl group having 1 to 4 carbon atoms. $R^6$ and $R^8$ are independent and each represent either COOH or OH. $R^5$ and $R^7$ are independent and each represent either H or an alkyl group having 1 to 4 carbon atoms. $R^9$ and $R^{11}$ represent H. $R^{10}$ represents either COOH or OH.

In Formula (1), "r" represents a positive number where $r \leq 1$. Within this range, the resin composition has particularly high hardening properties, and the phosphonium salt can be particularly easily dispersed and melted in the resin composition. It is more preferable to satisfy a relation of $1 \leq 1/r \leq 9$.

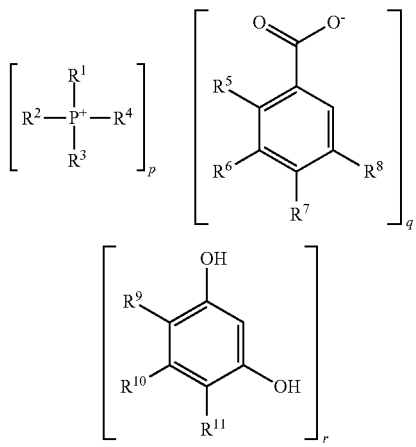

The above phosphonium salt is composed of a quaternary phosphonium cation shown in Formula (1.1) below, an organic carboxylate anion shown in Formula (1.2) below, and a phenolic compound shown in Formula (1.3) below.

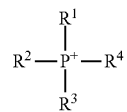

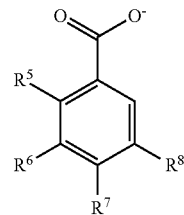

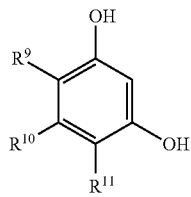

In the above phosphonium salt, the quaternary phosphonium cation shown in Formula (1.1) and the organic carboxylate anion shown in Formula (1.2) are ionically bonded together. Meanwhile, the organic carboxylate anion shown in Formula (1.2) and the phenolic compound shown in Formula (1.3) are hydrogen-bonded together. Therefore, the phosphonium salt is a complex compound. A conceptual model of the structure of this phosphonium salt is shown in Formula (2) below.

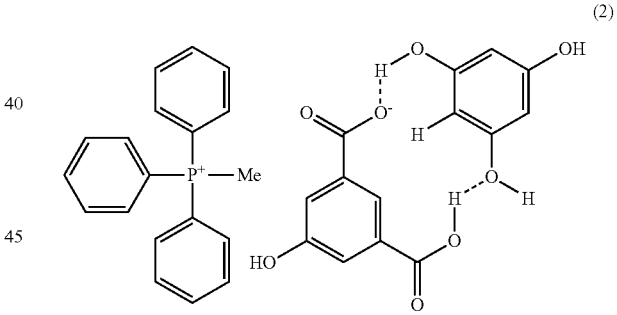

Using the phosphonium salt shown in Formula (1) can produce a resin composition excellent in fluidity, hardening properties, and preservation stability. The reason for this seems to be the interaction, described below, between the three elements: the quaternary phosphonium cation, the organic carboxylate anion, and the phenolic compound, which compose the phosphonium salt.

As shown in Formula (2), each of the organic carboxylate anion and the phenolic compound contains either a hydroxyl or carboxyl group at positions 1 and 3. The hydroxyl and carbonyl groups are substituents having hydrogen-bonding properties. Therefore, the interaction due to the hydrogen bonding acts strongly between the organic carboxylate anion and the phenolic compound. This increases the apparent acid strength of the organic carboxylate anion, making this anion and the phosphonium salt unlikely to be dissociated from each other. Consequently, the quaternary phosphonium cation and the organic carboxylate anion remain undissociated at normal temperature, thereby preventing the resin composition from being hardened. This seems to be the reason why the resin composition has excellent preservation stability.

At the beginning of heating of the resin composition, the strong interaction is kept between the organic carboxylate anion and the phenolic compound, thereby preventing the dissociation between the quaternary phosphonium cation and the organic carboxylate anion. Consequently, the hardening reaction does not progress soon after the resin composition starts to be heated, thereby preventing an increase in the melt viscosity of the resin composition. This seems to be the reason why the resin composition has excellent fluidity when molded. A little after the start of the heating, the interaction between the organic carboxylate anion and the phenolic compound gradually weakens, thereby dissociating the quaternary phosphonium cation and the organic carboxylate anion from each other. As a result, the hardening of the resin composition is accelerated. This seems to be the reason why the high fluidity and the hardening properties are compatible with each other.

According to the present exemplary embodiment, in Formula (1), $R^1$-$R^3$ are independent and each represent an aryl group having 6 to 12 carbon atoms, and $R^4$ represents an alkyl group having 1 to 4 carbon atoms. This is unlikely to cause the steric hindrance between the quaternary phosphonium cation and the organic carboxylate anion in the phosphonium salt, allowing this salt to be stable. Meanwhile, $R^6$ and $R^8$ are independent and each represent either COOH or OH, and $R^{10}$ represents either COOH or H. This enhances the interaction between the organic carboxylate anion and the phenolic compound. As a result, the resin composition is excellent in preservation stability, fluidity when molded, and hardening properties as described above. Furthermore, $R^5$ and $R^7$ are independent and represent either H or an alkyl group having 1 to 4 carbon atoms, respectively. This prevents functional groups reactive with the epoxy resin from being adjacent on an aromatic ring and is also unlikely to cause the steric hindrance around the functional groups reactive with the epoxy resin. Consequently, there is a low probability of leaving functional groups unreacted with the epoxy resin when the resin composition is hardened. As a result, the resin composition has high hardened product characteristics.

The phosphonium salt shown in Formula (1) does not contain benzene. Also, it never happens that benzene is generated during the synthesis of the phosphonium salt and then gets into this salt. Thus, the resin composition is unlikely to release benzene attributed to a hardening accelerator.

In addition, the phosphonium salt is easily dispersed and melted in the resin composition while this composition is prepared by heating and kneading the raw materials. Therefore, when the resin composition is used to seal a semiconductor element, the particles of the phosphonium salt are unlikely to fit into gaps between the wires or the bumps, which may otherwise cause insulation failure.

It is preferable that at least one of $R^6$ and $R^8$ should be COOH. This is because COOH is less nucleophilic than OH, so that while the phosphonium salt is reacting with the epoxy resin, OH is preferentially consumed and COOH remains unreacted. The remaining COOH is hydrogen-bonded with the OH on the metal surface or the oxide film. The remaining COOH is also used to form a carboxylate salt together with the metallic element and is firmly bonded with respect to the metallic element. This makes the resin composition more excellent in preservation stability, fluidity when molded, and hardening properties. When $R^{10}$ represents OH, as shown in Formula (2), the two carboxyl groups of the organic carboxylate anion can be hydrogen-bonded to the hydroxyl group, regardless of the position of the phenolic compound with respect to the two carboxyl groups.

Even if having a comparatively high melting or softening point of at least 200° C., the phosphonium salt is easily dispersed and melted in the resin composition. The reason for this seems to be that some intermolecular interaction improves the dispersibility of the phosphonium salt in the resin composition.

However, in order to make the phosphonium salt dispersed and melted more easily in the resin composition, the melting or softening point of the salt is preferably not more than 200° C., and more preferably in the range from 70° C. to 140° C. When the melting or softening point is 140° C. or lower, the salt is very easily dispersed and melted in the resin composition. When the melting or softening point is 70° C. or higher, the salt is pulverized into powder without being fused, and the powdered phosphonium salt is unlikely to agglomerate during storage. The melting or softening point is more preferably in the range from 80° C. to 120° C., and most preferably in the range from 90° C. to 100° C.

The melting or softening point of the phosphonium salt is determined, for example, as follows. First, the phosphonium salt is subjected to differential scanning calorimetry in air atmosphere at a temperature rise rate of 20° C./min to obtain a DSC curve. The temperature of the endothermic peak in the DSC curve is defined as the melting or softening point.

One approach to lowering the melting or softening point of the phosphonium salt is to master batch it with phenol resin. The phenol resin preferably has low viscosity. Examples of the phenol resin include the following: bisphenol A resins, bisphenol F resins, phenol novolac resins, cresol novolac resins, and phenol aralkyl resins. The master batch can be achieved by well-known methods.

The phosphonium salt is preferably in powder form so as to be very easily dispersed and melted in the resin composition. One approach to powdering the phosphonium salt is to use, for example, an impact grinder. It is preferable that 95% or greater by mass of the powdered phosphonium salt should pass through 100 meshes (an aperture of 212 μm). Whether it passes through the 100 meshes is measured with an air jet sieve. When in such a fine powder form, the phosphonium salt is very easily dispersed and melted in the resin composition.

The synthesis method of the phosphonium salt shown in Formula (1) is not particularly limited, and one approach is as follows. First, an intermediate composed of the quaternary phosphonium cation shown in Formula (1.1) and the organic carboxylate anion shown in Formula (1.2) is synthesized. Next, the intermediate is mixed with the phenolic compound shown in Formula (1.3) to obtain the phosphonium salt.

The intermediate can be produced by, for example, the methods disclosed in PTL 5 as follows. As one approach, an alkyl carbonate of quaternary phosphonium, which corresponds to the quaternary phosphonium cation shown in Formula (1.1), is subjected to a salt exchange reaction with an organic carboxylic acid, which corresponds to the organic carboxylate anion shown in Formula (1.2). As another approach, a hydroxide of quaternary phosphonium, which corresponds to the quaternary phosphonium cation shown in Formula (1.1), is subjected to a salt exchange reaction with an organic carboxylic acid, which corresponds to the organic carboxylate anion shown in Formula (1.2).

The alkyl carbonate of quaternary phosphonium can be obtained, for example, by reacting tertiary phosphine corresponding to quaternary phosphonium with a diester carbonate. Examples of the tertiary phosphine include the following: triphenylphosphine, tris(4-methylphenyl)phosphine, and 2-(diphenylphosphino)biphenyl. Examples of the diester carbonate include the following: diethyl carbonate, dimethyl carbonate, dibutyl carbonate, and diphenyl carbonate. The reaction can be completed quickly and in good yield by being performed in a solvent, such as methanol and ethanol. One approach to synthesizing the alkyl carbonate of quaternary phosphonium is as follows. A reaction solution is prepared by putting tertiary phosphine and a diester carbonate into a solvent. Next, the reaction solution is reacted in an autoclave at a temperature from 50° C. to 150° C. for 10 to 200 hours.

Meanwhile, the hydroxide of quaternary phosphonium can be obtained, for example, by reacting the tertiary phosphine corresponding to the quaternary phosphonium with either an alkyl or aryl halide, and then being salt-exchanged with inorganic alkali. The tertiary phosphine can be the same as used to obtain the alkyl carbonate of quaternary phosphonium. Examples of the alkyl halide include the following: ethyl bromide, butyl chloride, 2-ethylhexyl bromide, 2-butylethanol, and 2-chloropropanol. Examples of the aryl halide include the following: bromobenzene, bromonaphthalene, and bromobiphenyl. Examples of the inorganic alkali include the following: sodium hydroxide, potassium hydroxide, calcium hydroxide, barium hydroxide, and aluminum hydroxide. The reaction can be completed quickly and in good yield by being performed in a solvent, such as methanol and ethanol. One approach to synthesizing the hydroxide of quaternary phosphonium is as follows. A reaction solution is prepared by putting tertiary phosphine, either an alkyl or aryl halide, and inorganic alkali into a solvent. Next, the reaction solution is reacted in an autoclave at a temperature from 20° C. to 150° C. for 1 to 20 hours.

Either the alkyl carbonate or hydroxide of quaternary phosphonium synthesized as above is reacted with an organic carboxylic acid. The solution containing them is reacted, for example, at a temperature from 30° C. to 170° C. for 1 to 20 hours. In this case, by-products such as alcohol, water, carbon dioxide gas, and if necessary the solvent are removed. Thus, the salt exchange reaction produces the intermediate.

It is preferable that the intermediate should be synthesized by a salt exchange reaction between the alkyl carbonate of quaternary phosphonium and the organic carboxylic acid. In this case, the phosphonium salt which is the final product is unlikely to be contaminated with ionic impurities such as halogen ions. This prevents migration in the sealant formed of the resin composition containing the phosphonium salt. A semiconductor device containing this sealant is highly reliable.

As described above, mixing the intermediate and the phenolic compound results in the phosphonium salt shown in Formula (1). More specifically, for example, the intermediate and the phenolic compound are mixed in a solvent such as methanol and ethanol at a temperature from 50° C. to 200° C. for 1 to 20 hours, and then the solvent is removed. The solvent can be removed by heating the solution at a temperature from 50° C. to 200° C. under reduced or normal pressure. As a result, the phosphonium salt is obtained.

It is preferable that the content of halogen ions as impurities in the phosphonium salt should be 5 ppm or less. This makes it particularly unlikely that the sealant formed of the resin composition causes migration, thereby allowing the semiconductor device containing this sealant to have very high reliability. Such a low content of the halogen ions can be achieved by synthesizing the phosphonium salt by a method including the salt exchange reaction between the alkyl carbonate of quaternary phosphonium and the organic carboxylic acid.

The content of the phosphonium salt shown in Formula (1) is preferably 1 to 20 parts by mass per 100 parts by mass of the epoxy resin. When the content of the salt 1 part or greater by mass, the resin composition has excellent hardening properties. When the content of the salt is 20 parts or less by mass, the resin composition has excellent fluidity when molded. It is particularly preferable that the content of the phosphonium salt should be in the range from 2 to 15 parts by mass.

The resin composition is allowed to contain another hardening accelerator in addition to the phosphonium salt shown in Formula (1) within the range of the object of the present disclosure. The hardening accelerator may contain at least one selected from the group consisting of triaryl phosphines; tetraphenylphosphonium tetraphenylborate; imidazoles such as 2-methylimidazole; and 1,8-diazabicyclo [5.4.0]undecene-7, in addition to the phosphonium salt. The content of this additional hardening accelerator is preferably not more than 50% by mass of the whole hardening accelerator including the phosphonium salt.

The epoxy resin used in the present exemplary embodiment is a compound having at least two epoxy groups per molecule. Such an epoxy resin can be at least one selected from the group consisting of bisphenol A epoxy resins, phenol novolac epoxy resins, cresol novolac epoxy resins, biphenyl epoxy resins, and triphenylmethane epoxy resins. In order to improve the reliability of the semiconductor device, it is particularly preferable to contain at least one of biphenyl epoxy resins and low moisture-absorbing epoxy resins having a phenyl ring with a lower alkyl group. The epoxy equivalent weight of the epoxy resin is preferably in the range from 150 to 290. The softening or melting point of the epoxy resin is preferably in the range from 50° C. to 130° C.

In the present exemplary embodiment, a hardening agent is used to harden the above-mentioned epoxy resin. Such a hardening agent is preferably selected from the group consisting of phenolic compounds, acid anhydrides, and functional compounds generating phenolic hydroxyl groups. Using a hardening agent containing at least one of phenolic compounds and functional compounds allows the sealant formed of the resin composition to have very high moisture-resistance reliability.

Examples of the phenolic compound as a hardening agent includes the following: monomers, oligomers, and polymers which have at least two phenolic hydroxyl groups per molecule. This type of hardening agent can contain at least one selected from the group consisting of phenol novolac resins, cresol novolac resins, biphenyl novolac resins, triphenylmethane resins, naphthol novolac resins, phenol aralkyl resins, and biphenyl aralkyl resins. To make the semiconductor device have high reliability, it is preferable that the hardening agent should contain at least one of low moisture-absorbing phenol aralkyl resins and biphenyl aralkyl resins. The hydroxyl group equivalent weight of the phenolic compound, when used as the hardening agent, is preferably in the range from 0.5 to 2.0 and more preferably in the range from 0.8 to 1.4 per equivalent weight of the epoxy groups of the epoxy resin.

As the acid anhydrides used as the hardening agent, at least one selected from the group consisting of phthalic anhydrides, trimellitic anhydrides, pyromellitic dianhydrides, maleic anhydrides, benzophenone tetracarboxylic acid anhydrides, hexahydrophthalic anhydrides, tetrahydrophthalic anhydrides, methylhexahydrophthalic anhydrides, methyltetrahydrophthalic anhydrides, and polyazelaic polyanhydrides can be used. The acid anhydride, when used as the hardening agent, is preferably contained in the range from 0.7 to 1.5 equivalent weights, and more preferably in the range from 0.8 to 1.2 equivalent weights per equivalent weight of the epoxy groups of the epoxy resin.

Some functional compounds generate phenolic hydroxyl groups used as a hardening agent when these compounds are heated. Specific examples of the functional compound include benzoxazines which open their rings when heated and generate phenolic hydroxyl groups.

In the present exemplary embodiment, the epoxy resin composition can contain any materials that are generally used as the inorganic filler therein. Examples of the inorganic filler include the following: various kinds of silicas, spherical alumina, magnesium oxide, boron nitride, and aluminum nitride. Examples of the silica include the following: molten silica, spherical silica, spherical molten silica, crushed silica, and crystalline silica. Other examples of the inorganic filler include high dielectric fillers, magnetic fillers, and inorganic flame retardants. Examples of the high dielectric filler include barium titanate and titanium oxide. One example of the magnetic fillers is a hard ferrite. Examples of the inorganic flame retardants include the following: magnesium hydroxide, aluminum hydroxide, antimony trioxide, antimony pentoxide, guanidine salts, zinc borate, molybdenum compounds, and zinc tin oxide. Still other examples of the inorganic filler include the following: talc, barium sulfate, calcium carbonate, and mica powders. The resin composition of the present exemplary embodiment can contain as the inorganic filler at least one selected from the group consisting of the above-mentioned various inorganic materials.

It is particularly preferable that the inorganic filler should contain a spherical molten silica. This filler preferably has an average particle size in the range from 3 to 40 μm to make the resin composition have excellent fluidity when molded. The average particle size is measured with a laser diffraction scattering particle size analyzer.

The content of the inorganic filler is preferably in the range from 70 to 95% by mass with respect to a total of the resin composition. When the content of the filler is 95% or less by mass, the resin composition has excellent fluidity when molded, thereby preventing failures such as wire sweep and insufficient filling from occurring. When the content of the filler is 70% or greater by mass, the resin composition is unlikely to have excessively high melt viscosity when molded. This prevents the sealant formed of the resin composition from having a defective appearance due to voids. The content of the inorganic filler is further preferably in the range from 85 to 92% by mass with respect to the total of the resin composition.

The resin composition can further contain the additives such as a silane coupling agent, a flame retardant, a flame retardant auxiliary agent, a mold release agent, an ion-trapping agent, a pigment such as carbon black, a colorant, a stress decreasing agent, a tackifier, and a silicone flexibilizer.

The silane coupling agent preferably has at least two alkoxy groups per molecule. This coupling agent can contain at least one selected from the group consisting of β-(3,4-epoxycyclohexyl)ethyltrimethoxysilane, N-phenyl-γ-aminopropyltrimethoxysilane, γ-glycidoxypropyltrimethoxysilane, γ-mercaptopropyltrimethoxysilane, γ-(2-aminoethyl)aminopropyltrimethoxysilane, γ-mercaptopropylmethyldimethoxysilane, γ-anilinopropyltrimethoxysilane, and hexamethyldisilazane.

The flame retardant can contain a novolac brominated epoxy resin, a metal hydroxide, etc., and preferably contains at least one of diantimony trioxide and a diantimony pentoxide.

The mold release agent can contain higher fatty acids, higher fatty acid esters, a higher fatty acid calcium, etc.; for example, at least one of carnauba waxes and polyethylene waxes.

The ion-trapping agent can contain a well-known compound having ion-trapping ability, such as hydrotalcites and a bismuth hydroxide.

Examples of the stress decreasing agent include silicone compounds, and butadiene-based rubbers such as methyl acrylate-butadiene-styrene copolymers and methyl methacrylate-butadiene-styrene copolymers.

A method of producing the resin composition will now be described as follows. First of all, the phosphonium salt shown in Formula (1) is mixed with an epoxy resin, a hardening agent, an inorganic filler, and an additive if necessary. The obtained mixture is melt-mixed in a kneading machine such as a hot twin-roll kneader or a kneader. Next, the mixture is cooled to room temperature and pulverized by a well-known method, thereby preparing the resin composition in powder form. This powdery resin composition may be formed into a tablet with dimensions and mass suitable for molding conditions.

The hardened product obtained by thermally hardening (curing) the resin composition is suitable as a sealant used to seal a semiconductor chip in a semiconductor device. A semiconductor device including such a sealant will now be described with reference to FIGURE. FIGURE is a sectional view of semiconductor according to the present exemplary embodiment.

Device 10 includes leadframe 53, semiconductor element 50, wires 56, and sealant 62. Semiconductor element 50 is mounted on leadframe 53. Wires 56 connect leadframe 53 to semiconductor element 50. Sealant 62 seals element 50, wires 56, and at least a part of leadframe 53. Sealant 62 is a hardened product of the above-mentioned resin composition.

Semiconductor element 50 can be any of the following: an integrated circuit, a large-scale integrated circuit, a transistor, a thyristor, a diode, a solid-state imaging element, etc. Element 50 may alternatively be any of new power devices such as SiC and GaN power devices.

Examples of packages of semiconductor device 10 include the following: pin insertion type packages such as Mini, Dpak, D2pak, To220, To3p, and dual inline packages (DIP), and surface-mount packages such as quad flat packages (QFP), small outline packages (SOP), small outline J-lead packages (SOJ), plastic ball grid arrays (PBGA), and wafer level packages (WLP).

In these packages, semiconductor element 50 is fixed, for example, on die pad 58 of leadframe 53 via die-bonded product 60. The electrode pad (not shown) of semiconductor element 50 and leadframe 53 are electrically connected via wires 56.

Thus, semiconductor device 10 can have a base for supporting semiconductor element 50. In the above-described example, die pad 58 functions as the base; alternatively, for example, a leadframe or a wiring board may be used as the base. Sealant 62 can be produced by well-known molding techniques such as transfer molding, compression molding, and injection molding.

Semiconductor device 10 can be manufactured, for example, as follows. First, semiconductor element 50 is mounted on the base, and electrically connected to leadframe 53 by flip-chip bonding, wire bonding, or other methods. Next, leadframe 53 on which semiconductor element 50 is mounted is set in a mold used for transfer molding. In this state, the resin composition is heated until melted, then injected in the mold, and further heated in the mold. Thus, the resin composition is thermally hardened to form sealant 62.

Sealant 62 is formed, for example, by transfer molding as follows. The mold temperature is in the range from 160 to 185° C., and the molding time is in the range of 60 to 120 seconds. The molding conditions can be properly changed according to the ingredients and other properties of the resin composition.

EXAMPLES

The present disclosure will now be described in detail in the following examples, but is not limited to them.

Preparation of a Sealing Epoxy Resin Composition

In each of examples and comparative examples, first of all, an inorganic filler is surface-treated with a coupling agent. The treated filler is well mixed with a hardening accelerator, an epoxy resin, a phenolic compound, a mold release agent, and a colorant in a mixer to prepare a mixture. This mixture is melt-kneaded on a twin-roll kneader at 100° C. for 5 minutes, cooled, and crushed in a grinding mill so as to prepare powdery resin composition.

The ingredients and their amounts used in each of examples and comparative examples are shown in Tables 1 and 2 shown below. The amounts are shown by parts by mass in these tables. The details of each ingredient are as follows:

Hardening accelerator 1: a reaction product of TPPK and a phenol novolac resin, produced by Panasonic Corp.

Hardening accelerator 2: TPPK produced by Hokko Chemical Industry Co., Ltd.

Hardening accelerator 3: MeTPP-5HIPA-THB PN resin MB (masterbatch), produced by San-Apro Ltd.

Hardening accelerator 4: MeTPP-5HIPA-THB produced by San-Apro Ltd.

Hardening accelerator 5: MeTPP-THB produced by San-Apro Ltd.

Hardening accelerator 6: MeTPP-PN resin salt produced by San-Apro Ltd.

Hardening accelerator 7: MeTPP-5HIPA produced by San-Apro Ltd.

Hardening accelerator 8: MeTPP-5HIPA-THB (1<r) produced by San-Apro Ltd.

Hardening accelerator 9: MeTBP-5HIPA-THB produced by San-Apro Ltd.

Epoxy resin 1: YX4000H (tetramethylbiphenyl epoxy resin) produced by Mitsubishi Chemical Corporation, Epoxy resin 2: NC3000 (biphenyl aralkyl epoxy resin) produced by Nippon Kayaku Co., Ltd., Phenolic compound 1: DL-95 (phenol novolac resin) produced by Meiwa Plastic Industries, Ltd., Phenolic compound 2: MEH7851SS (biphenyl aralkyl phenol resin) produced by Meiwa Plastic Industries, Ltd., THB produced by Tokyo Chemical Industry Co., Ltd. (benzenetriol)

Mold release agent: F1-100 (carnauba wax) produced by Dainichi Chemical Industry Co., Ltd., Inorganic filler: FB940 (spherical molten silica) produced by Denki Kagaku Kogyo Kabushiki Kaisha, Coupling agent: KBM-803 (γ-mercaptopropyltrimethoxysilane) produced by Shin-Etsu Chemical Co., Ltd., Colorant: MA600 (carbon black) produced by Mitsubishi Chemical Corporation, These hardening accelerators shown in Tables will now be described in more detail.

Hardening accelerator 1 can be prepared as follows. TPPK and a low-viscosity phenol novolac resin (H-4 produced by Meiwa Plastic Industries, Ltd.) are heated at a temperature from 170 to 180° C. in a nitrogen atmosphere, and the resulting product is cooled and crushed. The concentration of the phosphonium cation is 10% by mass.

Hardening accelerator 2 is a commercially available tetraphenylphosphonium tetraphenylborate (TPPK) produced by Hokko Chemical Industry Co., Ltd.

Hardening accelerator 3 is prepared as follows. First, the phosphonium salt shown in Formula (3) is synthesized by a method including the salt exchange reaction between an alkyl carbonate of quaternary phosphonium and an organic carboxylic acid. This phosphonium salt is then masterbatched with the phenol novolac resin added during the synthesis. The content of the phenol novolac resin in this product is 15% by mass. Next, the product is made to pass through a mesh with an aperture of 212 μm. As a result, Hardening accelerator 3 is prepared in powder form.

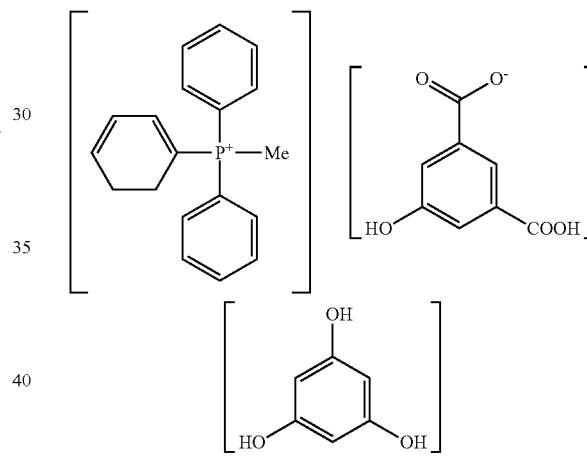

(3)

Hardening accelerator 4, which is in powder form, is prepared as follows. The crystals of the phosphonium salt shown in Formula (3), which is prepared in the same manner as in Hardening accelerator 3, are crushed and then made to pass through a mesh with an aperture of 212 μm.

Hardening accelerator 5, which is in powder form, is prepared as follows. The crystals of the compound having the structure shown in Formula (4) are crushed and then made to pass through a mesh with an aperture of 212 μm.

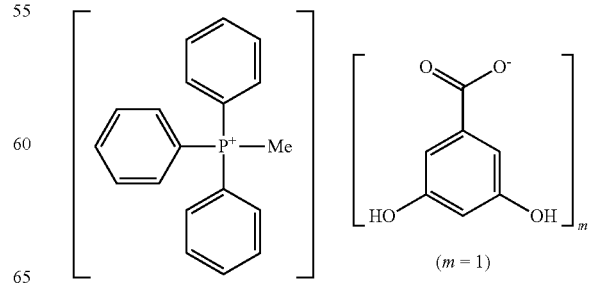

(4)

Hardening accelerator 6, which is in powder form, is prepared as follows. A resin salt is crushed. The resin salt has the structure shown in Formula (5), a melting point of 110° C., and a phosphonium cation concentration of 15% by mass. Next, the crushed resin salt is made to pass through a mesh with an aperture of 212 μm.

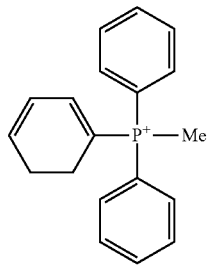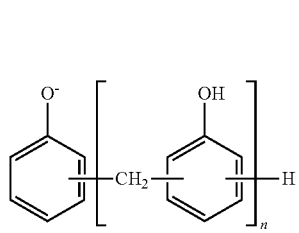

(5)

Hardening accelerator 7, which is in powder form, is prepared as follows. The crystals of the compound having the structure shown in Formula (6) are crushed and then made to pass through a mesh with an aperture of 212 μm.

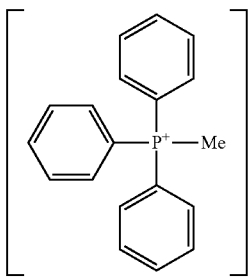

(6)

Hardening accelerator 8, which is in powder form, is prepared as follows. The crystals of the compound having the structure shown in Formula (7) are crushed and then made to pass through a mesh with an aperture of 212 μm.

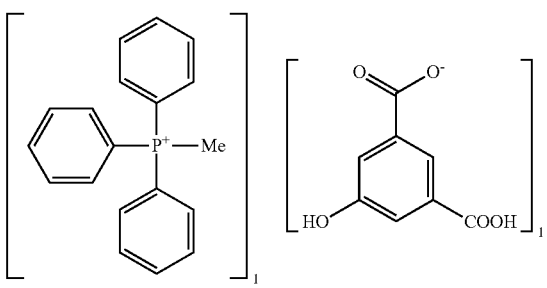

(7)

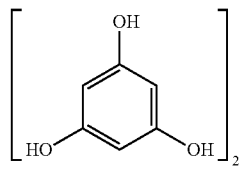

Hardening accelerator 9, which is in powder form, is prepared as follows. The crystals of the compound having the structure shown in Formula (8) are crushed and then made to pass through a mesh with an aperture of 212 μm.

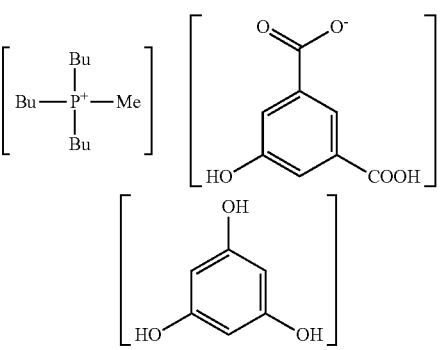

(8)

Hardening accelerators 1-9 prepared as above are subjected to the following evaluations. The evaluation results are shown in Tables 1 and 2.

Analysis of Impurity Ions

Each of Hardening accelerators 1-9 is put into hot water of 95° C. and held for 15 hours to prepare extracted water. The extracted water is analyzed by ion chromatography. The analysis results are used to determine the contents of chloride ions, bromide ions, sulfate ions, and sodium ions in each hardening accelerator. In Tables 1 and 2, ND indicates that no ions are detected because they exceeded the detectable limit.

Meltability Evaluation

Each resin composition obtained in each of the examples and the comparative examples is made into a tablet with a diameter of 13 mm and a thickness of 20 mm. One side of each tablet is ground eight times, thickness of 2 mm each. After each grinding operation, the ground surface is observed with a metallograph. In tables 1 and 2, "good" indicates that there is no observation of unmelted particles of the hardening accelerator on the ground surface, whereas "bad" indicates that there is at least one observation of unmelted particles of the hardening accelerator on the ground surface.

Gel Time Evaluation

As an index of the hardening properties, the gel time of the resin composition in each of the examples and the comparative examples is measured at 170° C. using a curelastometer manufactured by JSR Corporation. The gel time in this test is the period of time required from the start of the measurement until the torque reached 9.81 mN·m (0.1 kgf·cm).

Evaluation of Torque after 100 Seconds

When the gel time is measured, the torque value after 100 seconds from the start of the measurement is also measured. The larger the torque value is, the higher the strength and the hardness of the hardened product of the resin composition are evaluated.

Spiral Flow Length

As an index of fluidity when molded, the spiral flow length of the just completed resin composition is measured in each of the examples and the comparative examples. This measurement is performed using a spiral flow mold compliant with ASTM D 3123. The measurement conditions are as follows: the mold temperature is 170° C., the injection pressure is 6.9 MPa, and the molding time is 120 seconds.

Spiral Flow Retention

As an index of preservation stability, spiral flow retention is calculated as follows. First, the resin composition in each of the examples and the comparative examples is left at 25° C. for 96 hours, and its spiral flow length is measured. The percentage of the spiral flow length of the left resin composition with respect to that immediately after its production is calculated as the spiral flow retention.

Evaluation of Benzene Content Before Hardening the Composition

The resin composition in each of the examples and the comparative examples is heated in a hermetically sealed container, and left at 90° C. for 30 minutes. Next, gas inside the container is obtained, and the benzene content in the gas is measured by the headspace GC-MS method.

Evaluation of Benzene Content After Hardening the Composition

The resin composition in each of the examples and the comparative examples is heated at 175° C. for 6 hours so as to be thermally hardened. The resulting hardened product is heated in a hermetically sealed container and left at 90° C. for 30 minutes. Next, gas inside the container is obtained, and the benzene content in the gas is measured by the headspace GC-MS method.

TABLE 1

| | Comparative Examples | | | | | | |
|---|---|---|---|---|---|---|---|
| | 1 | 2 | 3 | 4 | 5 | 6 | 7 |
| hardening accelerator 1 | 10.18 | — | — | — | — | — | — |
| hardening accelerator 2 | — | 2.04 | — | — | — | — | — |
| hardening accelerator 3 | — | — | — | — | — | — | — |
| hardening accelerator 4 | — | — | — | — | — | — | — |
| hardening accelerator 5 | — | — | 1.635 | — | — | — | — |
| hardening accelerator 6 | — | — | — | 5.79 | — | — | — |
| hardening accelerator 7 | — | — | — | — | 4.78 | — | 4.28 |
| hardening accelerator 8 | — | — | — | — | — | 4.78 | — |
| hardening accelerator 9 | — | — | — | — | — | — | — |
| epoxy resin 1 | 67.88 | 67.88 | 68.14 | 68.45 | 68.21 | 68.21 | 68.21 |
| epoxy resin 2 | — | — | — | — | — | — | — |
| phenolic compound 1 | 28.40 | 36.54 | 36.69 | 32.22 | 33.47 | 33.47 | 33.47 |
| phenolic compound 2 | — | — | — | — | — | — | — |
| THB | — | — | — | — | — | — | 0.50 |
| mold release agent | 3 | 3 | 3 | 3 | 3 | 3 | 3 |
| inorganic filler | 885 | 885 | 885 | 885 | 885 | 885 | 885 |
| coupling agent | 3.54 | 3.54 | 3.54 | 3.54 | 3.54 | 3.54 | 3.54 |
| colorant | 2 | 2 | 2 | 2 | 2 | 2 | 2 |
| total | 1000 | 1000 | 1000 | 1000 | 1000 | 1000 | 1000 |
| Cl⁻ content (ppm) in the hardening accelerator | 7 | 2 | ND | ND | ND | ND | ND |
| Br⁻ content (ppm) in the hardening accelerator | 6 | 7 | ND | ND | ND | ND | ND |
| SO$_4^{2-}$ content (ppm) in the hardening accelerator | 2 | 1 | ND | ND | ND | ND | ND |
| Na⁺ content (ppm) in the hardening accelerator | 46 | 45 | 12 | 12 | 14 | 15 | 14 |
| meltability | good | bad | bad | good | bad | bad | bad |
| gel time (sec) | 45 | >150 | 48 | 43 | 43 | 55 | 50 |
| torque (N/m) after 100 seconds | 2.45 | — | 2.35 | 3.33 | 2.45 | 2.84 | 2.45 |
| spiral flow length (cm) | 170 | — | 175 | 151 | 165 | 172 | 168 |
| spiral flow length (cm) after leaving the composition | 148 | — | 160 | 136 | 149 | 160 | 147 |
| spiral flow retention (%) | 87 | — | 91 | 90 | 90 | 93 | 88 |
| benzene generation (ppm) before hardened | 40 | 85 | 0 | 0 | 0 | 0 | 0 |
| benzene generation (ppm) after hardened | 0 | 15 | 0 | 0 | 0 | 0 | 0 |

TABLE 2

| | Comparative Example | | Example | | | |
|---|---|---|---|---|---|---|
| | 8 | 9 | 1 | 2 | 3 | 4 |
| hardening accelerator 1 | — | 8.24 | — | — | — | — |
| hardening accelerator 2 | — | — | — | — | — | — |
| hardening accelerator 3 | — | — | 4.78 | — | 3.30 | — |
| hardening accelerator 4 | — | — | — | 3.49 | — | 2.41 |
| hardening accelerator 5 | — | — | — | — | — | — |
| hardening accelerator 6 | — | — | — | — | — | — |
| hardening accelerator 7 | — | — | — | — | — | — |
| hardening accelerator 8 | — | — | — | — | — | — |
| hardening accelerator 9 | 4.78 | — | — | — | — | — |
| epoxy resin 1 | 68.21 | 19.34 | 68.21 | 68.21 | 19.24 | 19.24 |
| epoxy resin 2 | — | 45.13 | — | — | 44.89 | 44.89 |
| phenolic compound 1 | 33.47 | 2.49 | 33.47 | 34.73 | 7.00 | 7.87 |

TABLE 2-continued

|  | Comparative Example | | Example | | | |
| --- | --- | --- | --- | --- | --- | --- |
|  | 8 | 9 | 1 | 2 | 3 | 4 |
| phenolic compound 2 | — | 36.28 | — | — | 37.04 | 37.04 |
| THB | — | — | — | — | — | — |
| mold release agent | 3 | 3 | 3 | 3 | 3 | 3 |
| inorganic filler | 885 | 880 | 885 | 885 | 880 | 880 |
| coupling agent | 3.54 | 3.52 | 3.54 | 3.54 | 3.52 | 3.52 |
| colorant | 2 | 2 | 2 | 2 | 2 | 2 |
| total | 1000 | 1000 | 1000 | 1000 | 1000 | 1000 |
| Cl$^-$ content (ppm) in the hardening accelerator | ND | 7 | ND | ND | ND | ND |
| Br$^-$ content (ppm) in the hardening accelerator | ND | 6 | ND | ND | ND | ND |
| SO$_4^{2-}$ content (ppm) in the hardening accelerator | ND | 2 | ND | ND | ND | ND |
| Na$^+$ content (ppm) in the hardening accelerator | 11 | 46 | 11 | 14 | 11 | 14 |
| meltability | good | good | good | good | good | good |
| gel time (sec) | 49 | 32 | 45 | 48 | 32 | 32 |
| torque (N/m) after 100 seconds | 2.45 | 0.88 | 3.53 | 3.63 | 1.57 | 1.37 |
| spiral flow length (cm) | 160 | 132 | 175 | 177 | 134 | 136 |
| spiral flow length (cm) after leaving the composition | 143 | 120 | 163 | 167 | 123 | 124 |
| spiral flow retention (%) | 89 | 91 | 93 | 94 | 92 | 91 |
| benzene generation (ppm) before hardened | 0 | 42 | 0 | 0 | 0 | 0 |
| benzene generation (ppm) after hardened | 0 | 0 | 0 | 0 | 0 | 0 |

The above results are considered as follows.

In Comparative Example 1, a well-known TPPK-PN resin MB is used as the hardening accelerator. As a result, benzene is not generated from the hardened resin composition, but is generated due to the reaction during the heating of the unhardened resin composition. This benzene can cause environmental pollution if released to the working environment.

In Comparative Example 2, a well-known TPPK is used as the hardening accelerator. As a result, the gel time exceeded 150 seconds, indicating a low production efficiency. Furthermore, the hardening accelerator partly remained unmelted in the composition. Moreover, a considerable amount of benzene is generated both before and after the resin composition is hardened. This benzene causes environmental pollution if released to the working environment.

In Comparative Example 3, MeTPP-THB salt is used as the hardening accelerator. As a result, the resin composition is excellent in fluidity and hardening properties, and the hardened product has excellent preservation stability. However, the hardening accelerator partly remained unmelted in the resin composition. Therefore, the particles of the hardening accelerator may get lodged between wires or bumps, thereby causing insulation failure.

In Comparative Example 4, MeTPP-PN resin salt is used as the hardening accelerator. As a result, the resin composition has excellent hardening properties; however, the spiral flow length is short, so that the fluidity is poor. Furthermore, the high change rate of the spiral flow length indicates poor preservation stability of the hardened product.

In Comparative Example 5, MeTPP-5HIPA is used as the hardening accelerator. As a result, no benzene is generated before or after the resin composition is hardened. However, no excellent results are observed when compared with Comparative Example 1.

In Comparative Example 6, MeTPP-5HIPA-THB (1<r) is used as the hardening accelerator. As a result, the gel time is long probably because THB (phloroglucinol) is in excess. Furthermore, the hardening accelerator partly remained unmelted.

In Comparative Example 7, MeTPP-5HIPA is used as the hardening accelerator and THB is added. As a result, the gel time is long, and the hardening accelerator partly remained unmelted.

In Comparative Example 8, MeTBP-5HIPA-THB is used as the hardening accelerator. As a result, the resin composition has much lower fluidity than in Comparative Example 1.

In Comparative Example 9, the well-known TPPK-PN resin MB is used as the hardening accelerator, as same as Comparative Example 1. However, other ingredients and their contents are different from those of Comparative Example 1. As a result, it is confirmed that benzene is generated during the heating of the unhardened resin composition although being different in ingredients from those of Comparative Example 1.

In Example 1, MeTPP-5HIPA-THB PN resin MB is used as the hardening accelerator. As a result, the resin composition is excellent in fluidity and hardening properties. Furthermore, the low change rate of the spiral flow indicates high preservation stability of the hardened product. Moreover, no unmelted particles of the hardening accelerator are observed.

In Example 2, MeTPP-5HIPA-THB is used as the hardening accelerator. As a result, the resin composition is excellent in fluidity and hardening properties. Furthermore, no unmelted particles of the hardening accelerator are observed in spite of its high melting point. The reason for this seems to be that some intermolecular interaction improves the dispersibility of MeTPP-5HIPA-THB in the composition.

In Example 3, MeTPP-5HIPA-THB PN resin MB is used as the hardening accelerator, as same Example 1. However, other ingredients and their contents are different from those of Example 1. The resin composition is more excellent in fluidity and hardening properties than in Comparative Example 9, which has similar ingredients to Example 3. Furthermore, the low change rate of the spiral flow indicates high preservation stability of the hardened product.

In Example 4, MeTPP-5HIPA-THB is used as the hardening accelerator, as the same as Example 2. However, other ingredients and their contents are different from those of Example 2. The resin composition is more excellent in fluidity and hardening properties than in Comparative Example 9, which has similar ingredients to Example 4. Furthermore, the low change rate of the spiral flow indicates high preservation stability of the hardened product.

Particularly, a comparison between Example 2, Comparative Examples 3, 5, and 7 reveals the following facts. Comparative Examples 3 and 5 are inferior to Example 2. In Example 2, the used hardening accelerator is composed of a quaternary phosphonium cation, an organic carboxylate anion, and a phenolic compound. On the other hand, Comparative Examples 3 and 5 do not use this kind of hardening accelerator. Meanwhile, in Comparative Example 7, the phenolic compound is added separately from the hardening accelerator composed of the quaternary phosphonium cation and the organic carboxylate anion. This makes it impossible for the resin composition of Comparative Example 7 to achieve the compatibility between the high fluidity and the hardening properties as shown in Example 2.

The sealing epoxy resin composition of the present disclosure is excellent in fluidity, hardening properties, and preservation stability. This composition is unlikely to release benzene attributed to a hardening accelerator and prevents the hardening accelerator from remaining unmelted. Such a sealing epoxy resin composition is suitable for use in sealing a semiconductor element, thereby manufacturing a semiconductor device.

What is claimed is:

1. A sealing epoxy resin composition comprising:
a phosphonium salt shown in Formula (1);
an epoxy resin;
a hardening agent; and
an inorganic filler,

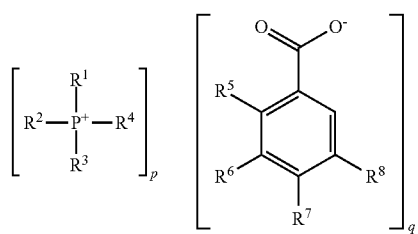

(1)

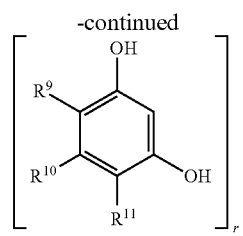

where $R^1$-$R^3$ are independent and each represent an aryl group having 6 to 12 carbon atoms;

$R^4$ represents an alkyl group having 1 to 4 carbon atoms;

$R^6$ and $R^8$ are independent and each represent either a carboxyl group or a hydroxyl group;

$R^5$ and $R^7$ are independent and each represent either hydrogen or an alkyl group having 1 to 4 carbon atoms;

$R^9$ and $R^{11}$ represent hydrogen;

$R^{10}$ represents either a carboxyl group or a hydroxyl group; and a relation of $0 \leq r \leq 1$ is satisfied.

2. The sealing epoxy resin composition according to claim 1, wherein in Formula (1), at least one of $R^6$ and $R^8$ represents a carboxyl group.

3. The sealing epoxy resin composition according to claim 2, wherein in Formula (1), $R^{10}$ represents a hydroxyl group.

4. The sealing epoxy resin composition according to claim 1, wherein the phosphonium salt is synthesized by a process including a salt exchange reaction between an alkyl carbonate of quaternary phosphonium and an organic carboxylic acid.

5. The sealing epoxy resin composition according to claim 1, wherein a content of halogen ion in the phosphonium salt is 5 ppm or less.

6. The sealing epoxy resin composition according to claim 1, wherein the hardening agent contains at least one selected from the group consisting of phenolic compounds and functional compounds generating phenolic hydroxyl groups.

7. A hardened product obtained by hardening the sealing epoxy resin composition according to claim 1.

8. A semiconductor device comprising:
a semiconductor element; and
a sealant sealing the semiconductor element, the sealant being composed of the hardened product according to claim 7.

* * * * *